US012308843B2

(12) United States Patent
Wang et al.

(10) Patent No.: US 12,308,843 B2
(45) Date of Patent: May 20, 2025

(54) MULTIPLE-REFERENCE-EMBEDDED COMPARATOR AND COMPARISON METHOD THEREOF

(71) Applicant: National Cheng Kung University, Tainan (TW)

(72) Inventors: Jia-Ching Wang, Taipei (TW); Tai-Haur Kuo, Tainan (TW)

(73) Assignee: National Cheng Kung University, Tainan (TW)

( * ) Notice: Subject to any disclaimer, the term of this patent is extended or adjusted under 35 U.S.C. 154(b) by 64 days.

(21) Appl. No.: 18/234,874

(22) Filed: Aug. 16, 2023

(65) Prior Publication Data

US 2025/0062757 A1    Feb. 20, 2025

(51) Int. Cl.
*H03K 5/24* (2006.01)
(52) U.S. Cl.
CPC .................... *H03K 5/2472* (2013.01)
(58) Field of Classification Search
CPC .................................................... H03K 5/2472
See application file for complete search history.

(56) References Cited

U.S. PATENT DOCUMENTS

| | | | |
|---|---|---|---|
| 10,917,100 B2 * | 2/2021 | Rattan | H03M 1/002 |
| 2019/0277891 A1 * | 9/2019 | Peng | H03F 3/45188 |
| 2024/0063765 A1 * | 2/2024 | Sedighi | H03F 3/45475 |

* cited by examiner

*Primary Examiner* — Daniel C Puentes
(74) *Attorney, Agent, or Firm* — Winston Hsu

(57) ABSTRACT

A multiple-reference-embedded comparator (MREC) circuit includes a tail current source circuit; an input transistor pair, coupled to the tail current source circuit, configured to receive differential input voltages and perform a first pre-amplification to generate first differential amplified voltages according to the differential input voltages; and a plurality of embedded reference (ER) branches, each coupled to the input transistor pair, each configured to perform a second pre-amplification to generate second differential amplified voltages according to the first differential amplified voltages, and to perform a discrete-time comparison to generate differential output voltages according to the second differential amplified voltages.

8 Claims, 5 Drawing Sheets

MULTIPLE-REFERENCE-EMBEDDED COMPARATOR AND COMPARISON METHOD THEREOF

BACKGROUND OF THE INVENTION

1. Field of the Invention

The present invention relates to a comparator circuit and a comparison method thereof, and more particularly, to a multiple-reference-embedded comparator circuit and a comparison method thereof.

2. Description of the Prior Art

Analog-to-digital converters (ADCs) typically require a large number of comparators to quickly complete data quantization and achieve a high-speed specification. However, the comparators may give rise to high power consumption and high circuitry cost. For example, a typical dynamic comparator includes a tail current source, an input differential pair and a latch. Thus, using multiple dynamic comparators (including multiple tail current sources, multiple input differential pairs and multiple latches) results in a substantial power consumption of the ADC and generates a great amount of heat that degrades ADC performance. In addition, a resistor ladder used to provide reference voltages to the dynamic comparators also results in a large power consumption. On the other hand, kickback errors and parasitic capacitances attributed to the input differential pair also degrade the ADC performance.

Therefore, how to improve the dynamic comparators to have a low power consumption and make the ADC to have high accuracy with a small circuit area has become one of the goals in the industry.

SUMMARY OF THE INVENTION

The present invention is to provide a multiple-reference-embedded comparator circuit and a comparison method with multiple references embedded.

The present invention provides a multiple-reference-embedded comparator (MREC) circuit, comprising a tail current source circuit; an input transistor pair, coupled to the tail current source circuit, configured to receive differential input voltages and perform a first pre-amplification to generate first differential amplified voltages according to the differential input voltages; and a plurality of embedded reference (ER) branches, each coupled to the input transistor pair, each configured to perform a second pre-amplification to generate second differential amplified voltages according to the first differential amplified voltages, and to perform a discrete-time comparison to generate differential output voltages according to the second differential amplified voltages.

The present invention provides a comparison method for a multiple-reference-embedded comparator (MREC) circuit, comprising utilizing an input transistor pair, coupled to a tail current source circuit, to perform a first pre-amplification to generate first differential amplified voltages according to differential input voltages; and utilizing each of a plurality of embedded reference (ER) branches, each coupled to the input transistor pair, to perform a second pre-amplification to generate second differential amplified voltages according to the first differential amplified voltages, and to perform a discrete-time comparison to generate differential output voltages according to the second differential amplified voltages.

These and other objectives of the present invention will no doubt become obvious to those of ordinary skill in the art after reading the following detailed description of the preferred embodiment that is illustrated in the various figures and drawings.

DETAILED DESCRIPTION

Certain terms used throughout the description and following claims to refer to particular components. As one skilled in the art will appreciate, hardware manufacturers may refer to a component by different names. This document does not intend to distinguish between components that differ in name but not function. In the following description and in the claims, the terms "include" and "comprise" are utilized in an open-ended fashion, and thus should be interpreted to mean "include, but not limited to". Also, the term "couple" is intended to mean either an indirect or direct electrical connection. Accordingly, if one device is coupled to another device, that connection may be through a direct electrical connection, or through an indirect electrical connection via other devices and connections.

Figure 1:
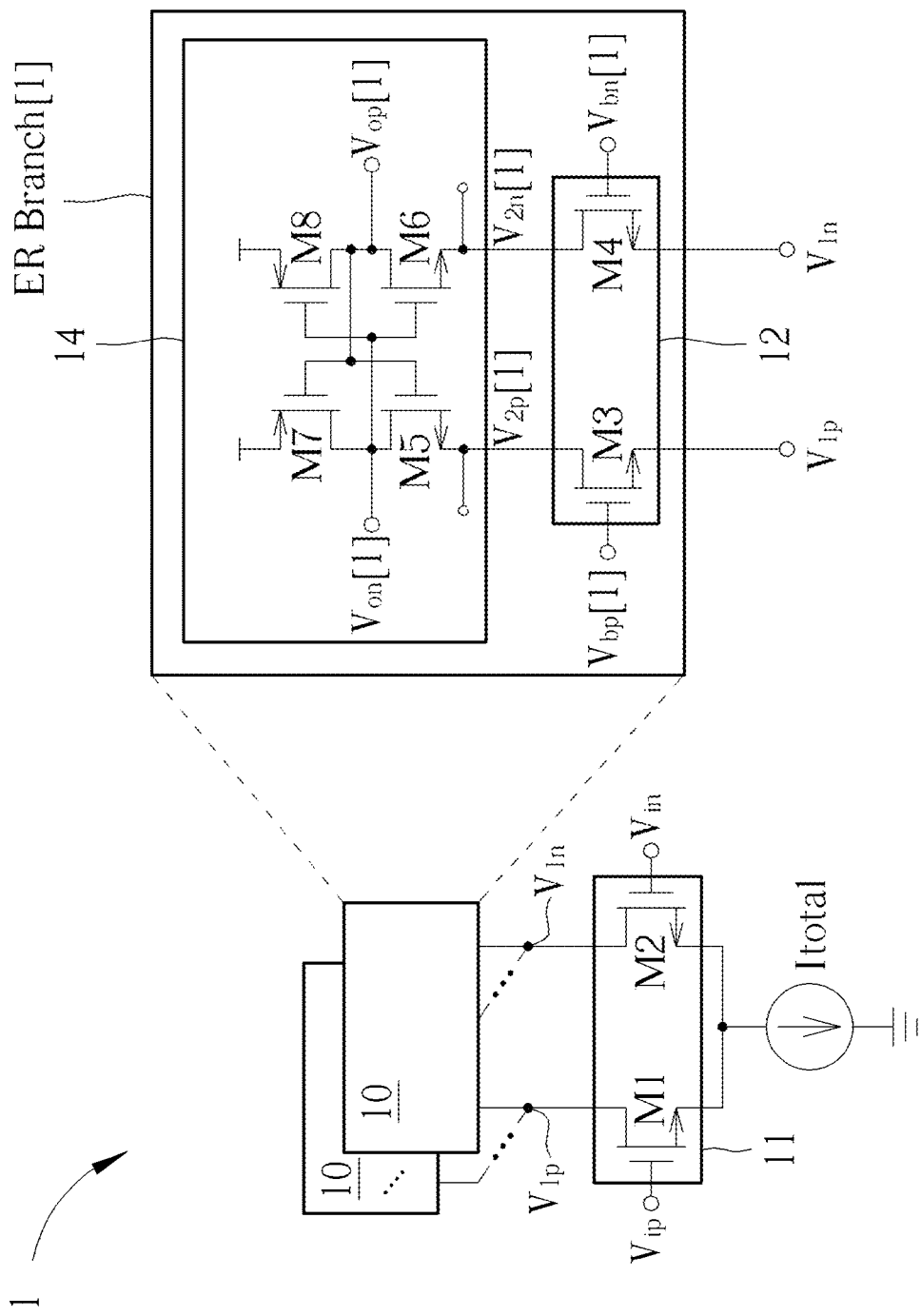
FIG. 1 is a schematic diagram of a multiple-reference-embedded comparator (MREC) circuit according to an embodiment of the present invention.

Please refer to FIG. 1. FIG. 1 is a schematic diagram of a multiple-reference-embedded comparator (MREC) circuit 1 according to an embodiment of the present invention. The MREC circuit 1 includes a tail current source circuit $I_{total}$, an input transistor pair 11 (M1+M2), and a plurality of embedded reference (ER) branches 10. The input transistor pair 11 is coupled to the tail current source circuit $I_{total}$, and is configured to receive differential input voltages $V_{ip}$ and $V_{in}$. Each of the plurality of ER branches 10 is coupled to the input transistor pair 11, and is configured to generate and output differential output voltages $V_{on}$ and $V_{op}$ as a comparison result according to the differential input voltages $V_{ip}$ and $V_{in}$. This allows n ER branches sharing the differential pair 11 and the tail current source $I_{total}$ to generate n comparison results, denoted as $V_{op}[1]$, $V_{on}[1]$ to $V_{op}[n]$, $V_{on}[n]$, where n≥2. For example, as shown in FIG. 1, a first ER branch of the ER branches generates and outputs a first comparison result as the differential output voltages $V_{on}[1]$ and $V_{op}[1]$.

Figure 2:
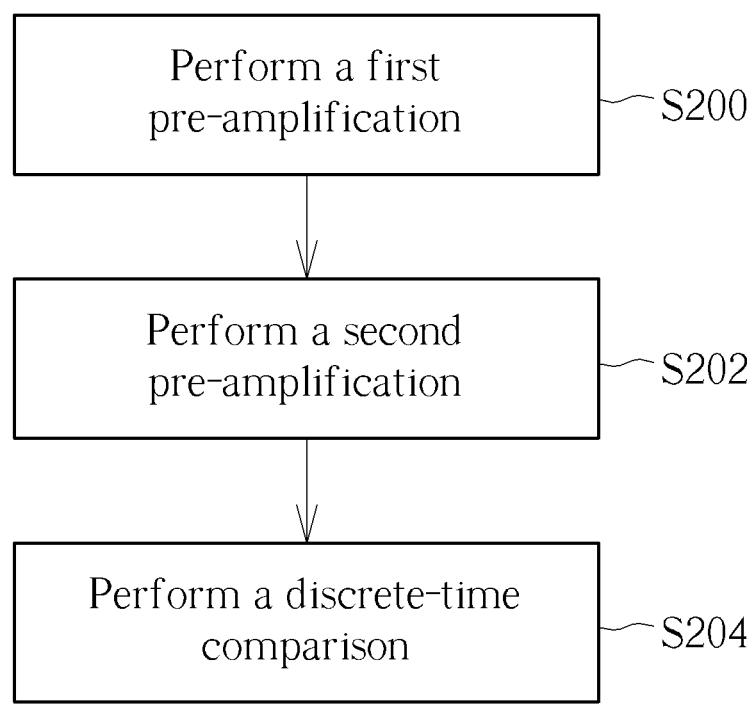
FIG. 2 is a flow chart of a comparison method according to an embodiment of the present invention.

In detail, a comparison method for the MREC circuit 1 may be summarized as a flow 2, as shown in FIG. 2. It should be noted that the operations of the plurality of ER branches are similar, so only the first ER branch is described. The flow 2 includes the following steps:

Step S200: Perform a first pre-amplification.
Step S202: Perform a second pre-amplification.
Step S204: Perform a discrete-time comparison.

In step S200, the input transistor pair M1 and M2 receives the differential input voltages $V_{ip}$ and $V_{in}$ and performs the first pre-amplification PA1 to generate first differential amplified voltages $V_{ip}$ and $V_{in}$ according to the differential input voltages $V_{ip}$ and $V_{in}$.

In step S202, the first ER branch includes an adjustor 12 and a latch circuit 14. The adjustor 12 is coupled between the input transistor pair 11 and the latch circuit 14. The adjustor 12 receives the first differential amplified voltages $V_{ip}$ and $V_{in}$ and performs the second pre-amplification PA2 to generate the second differential amplified voltages $V_{2p}[1]$ and $V_{2n}[1]$ according to the first differential amplified voltages $V_{ip}$ and $V_{in}$ and differential bias voltages $V_{bp}[1]$ and $V_{bn}[1]$.

In step S204, the latch circuit 14 receives the second differential amplified voltages $V_{2p}[1]$ and $V_{2n}[1]$ and performs the discrete-time comparison to generate the differential output voltages $V_{op}[1]$ and $V_{on}[1]$ as the first comparison result according to the second differential amplified voltages $V_{2p}[1]$ and $V_{2n}[1]$.

Specifically, as shown in FIG. 1, the input transistor pair 11 includes a first field-effect transistor M1, including a first drain, a first gate and a first source, and a second field-effect transistor M2, including a second drain, a second gate and a second source. The first source and the second source are coupled to the tail current source circuit $I_{total}$; the first gate and the second gate are configured to receive the differential input voltages $V_{ip}$ and $V_{in}$; and the first drain and the second drain are coupled to the plurality of ER branches to output the first differential amplified voltages $V_{ip}$ and $V_{in}$.

On the other hand, the adjustor 12 includes a third field-effect transistor M3, including a third drain, a third gate and a third source, and a fourth field-effect transistor M4, including a fourth drain, a fourth gate and a fourth source. The third source and the fourth source receive the first differential amplified voltages $V_{ip}$ and $V_{in}$, respectively; the third gate and the fourth gate receive the differential bias voltages $V_{bp}[1]$ and $V_{on}[1]$, respectively; and the third drain and the third drain are coupled to the latch circuit 14 to output the second differential amplified voltages $V_{2p}[1]$ and $V_{2n}[1]$.

Furthermore, the latch circuit 14 includes a fifth field-effect transistor M5, including a fifth drain, a fifth gate and a fifth source, a sixth field-effect transistor M6, including a sixth drain, a sixth gate and a sixth source, a seventh field-effect transistor M7, including a seventh drain, a seventh gate and a seventh source, and an eighth field-effect transistor M8, including an eighth drain, an eighth gate and an eighth source. The fifth source and the sixth source receive the second differential amplified voltages $V_{2p}[1]$ and $V_{2n}[1]$, respectively; the seventh source and the eighth source are coupled to a supply voltage $V_{DD}$; the fifth gate, the seventh gate, the sixth drain and the eight drain are coupled to a first output node; and the sixth gate, the eighth gate, the fifth drain and the seventh drain are coupled to a second output node. The first output node and the second output node output the differential output voltages $V_{op}[1]$ and $V_{on}[1]$, respectively.

Figure 3:
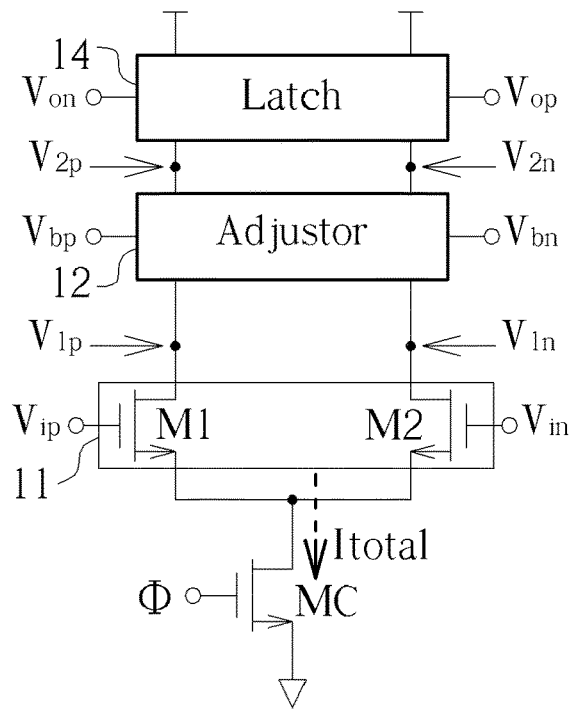
FIG. 3 is a schematic diagram of a MREC circuit with a single ER branch according to an embodiment of the present invention.
Figure 4:
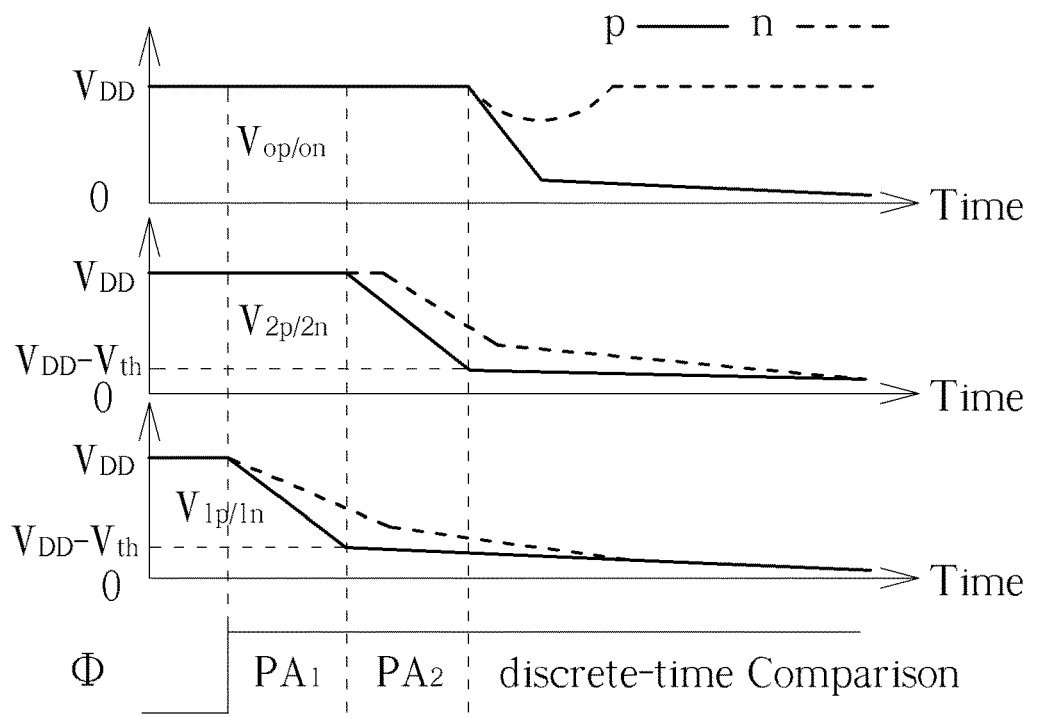
FIG. 4 is waveform diagrams of the first differential amplified voltages, the second differential amplified voltages, and the differential output voltages of the embodiment of the present invention.

It should be noted that the circuit schematic diagram of the above-mentioned ER branch is only an embodiment of the present invention, and those skilled in the art may make appropriate adjustments according to the circuit requirements. The following description only shows the symbols for the adjustor 12 and the latch circuit 14 to illustrate the operation of the comparison method. Please refer to FIG. 3 and FIG. 4. FIG. 3 is a schematic diagram of an MREC circuit 3 with a single ER branch (the adjustor 12 and the latch circuit 14) according to an embodiment of the present invention. FIG. 4 shows waveform diagrams of the first differential amplified voltages $V_{ip}$ and $V_{in}$, the second differential amplified voltages $V_{2p}$ and $V_{an}$, and the differential output voltages $V_{op}$ and $V_{on}$ of the embodiment of the present invention. As shown in FIG. 3 and FIG. 4, when the tail current source (Mc) is turned on (Φ turns to high), the MREC circuit 3 starts to operate. The input transistor pair 11 receives the differential input voltages $V_{ip}$ and $V_{in}$ and performs the first pre-amplification PA1 to generate first differential amplified voltages $V_{ip}$ and $V_{in}$. The adjustor 12 receives differential bias voltages $V_{bp}$ and $V_{on}$ and the first differential amplified voltages $V_{ip}$ and $V_{in}$ to perform the second pre-amplification PA2 to generate the second differential amplified voltages $V_{2p}$ and $V_{2n}$. Specifically, for the first pre-amplification PA1, the first drain and the second drain of the input transistor pair M1 and M2 are discharged from the supply voltage $V_{DD}$ toward ($V_{bp}$-$V_{th}$) and ($V_{bn}$-$V_{th}$), respectively, so that the adjustor 12 is turned on, where $V_{th}$ is a threshold voltage of the transistors. For the second pre-amplification PA2, the third drain and the fourth drain of the adjustor 12 are discharged from the supply voltage $V_{DD}$ toward a voltage drop as the threshold voltage $V_{th}$, so that the latch circuit 14 is turned on. The latch circuit 14 receives the second differential amplified voltages $V_{2p}$ and $V_{an}$ to generate differential output voltages $V_{op}$ and $V_{on}$ as the comparison result.

Figure 5:
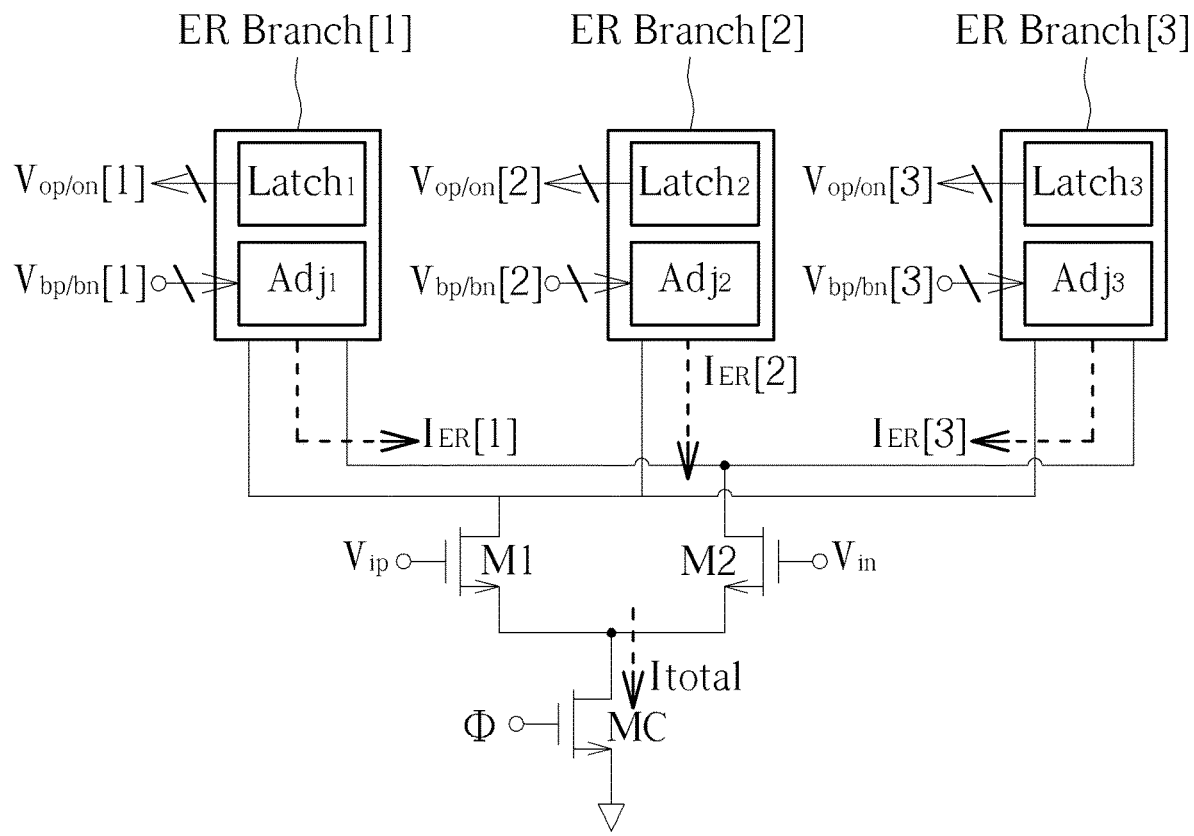
FIG. 5 is a schematic diagram of a MREC circuit with three ER branches according to an embodiment of the present invention.
Figure 6:
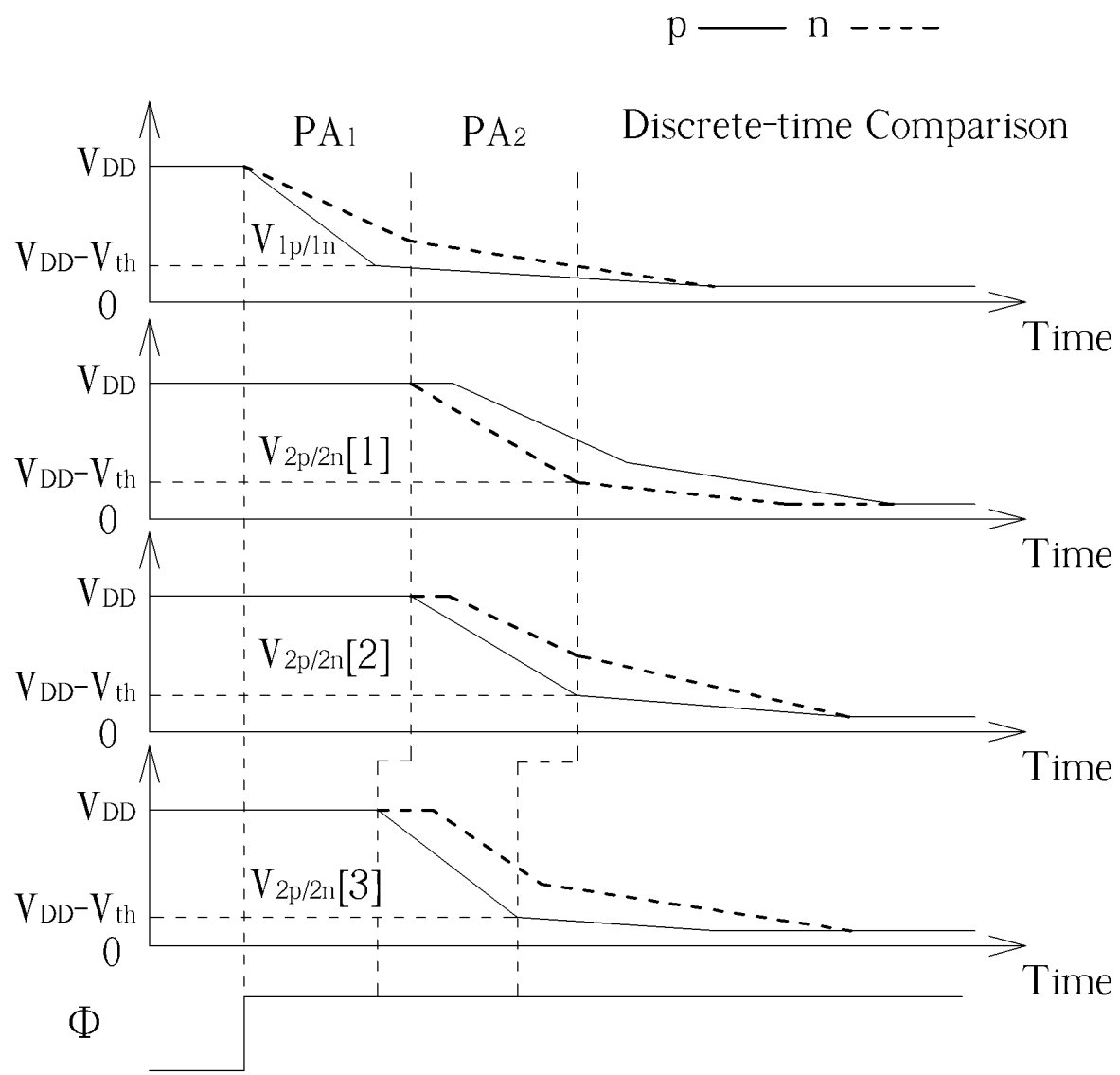
FIG. 6 is waveform diagrams of the first differential amplified voltages, the second differential amplified voltages of the three ER branches of the embodiment of the present invention.

Please refer to FIG. 5 and FIG. 6. FIG. 5 is a schematic diagram of an MREC circuit 4 with three ER branches (ER branch[1], ER branch[2] and ER branch[3]) according to an embodiment of the present invention. FIG. 6 shows waveform diagrams of the first differential amplified voltages $V_{ip}$ and $V_{in}$, the second differential amplified voltages of the three ER branches of the embodiment of the present invention. As shown in FIG. 5 and FIG. 6, when the tail current source (Mc) is turned on (Φ turns to high), the MREC circuit 4 starts to operate. The input transistor pair M1 and M2 receives the differential input voltages $V_{ip}$ and $V_{in}$ and performs the first pre-amplification PA1 to generate first differential amplified voltages $V_{ip}$ and $V_{in}$. A first adjustor circuit Adj1 of the ER branch [1] receives differential bias voltages $V_{bp}[1]$ and $V_{on}[1]$ and the first differential amplified voltages $V_{ip}$ and $V_{in}$ to perform the second pre-amplification PA2 to generate second differential amplified voltages $V_{2p}[1]$ and $V_{2n}[1]$. By the same mechanism, a second adjustor circuit Adj2 of the ER branch[2] performs the second pre-amplification PA2 to generate second differential amplified voltages $V_{2p}[2]$ and $V_{an}[2]$, and a third adjustor circuit Adj3 of the ER branch[3] performs the second pre-amplification PA2 to generate second differential amplified voltages $V_{2p}[3]$ and $V_{an}[3]$. Latch circuits latch1, latch2 and latch3 generate differential output voltages as three comparison results accordingly. In short, as shown in FIG. 5 and FIG. 6, for the first pre-amplification PA1, the first drain and the second drain of the input transistor pair M1 and M2 are discharged from the supply voltage $V_{DD}$ toward ($V_{bp}$-$V_{th}$) and ($V_{bn}$-$V_{th}$), respectively, so that the adjustors Adj1, Adj2 and Adj3 are turned on. On the other hand, for the second pre-amplification PA2, the third drain and the fourth drain of the adjustors Adj1, Adj2 and Adj3 are discharged from the supply voltage $V_{DD}$ toward a voltage drop as the threshold voltage $V_{th}$, so that the latch circuits latch1, latch2 and latch3 are turned on, respectively. The latch circuits latch1, latch2 and latch3 receive second differential amplified voltages $V_{2p/2n}[1]$, $V_{2p/2n}[2]$ and $V_{2p/2n}[3]$ to generate differential output voltages $V_{op/on}[1]$, $V_{op/on}[2]$ and $V_{op/on}[3]$ as the comparison results, respectively.

In summary, in the embodiment of the present invention, the plurality of ER branches share a tail current source and an input differential transistor pair performing the first pre-amplification to perform the plurality of the second pre-amplification and the plurality of the discrete-time comparison. Therefore, compared with the prior art, the MREC circuit of the present invention achieves a low power consumption, and occupies a smaller circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multiple-reference-embedded comparator (MREC) circuit, comprising:
   a tail current source circuit;
   an input transistor pair, coupled to the tail current source circuit, configured to receive differential input voltages and perform a first pre-amplification to generate first differential amplified voltages according to the differential input voltages; and
   a plurality of embedded reference (ER) circuits, each coupled to the input transistor pair, each configured to perform a second pre-amplification to generate second differential amplified voltages according to the first differential amplified voltages, and to perform a discrete-time comparison to generate differential output voltages according to the second differential amplified voltages;
   wherein each of the plurality of ER circuits comprises:
      an adjustor circuit, coupled to the input transistor pair, configured to perform the second pre-amplification to generate the second differential amplified voltages according to the first differential amplified voltages and differential bias voltages; and
      a latch circuit, coupled to the adjustor circuit, configured to perform the discrete-time comparison to generate the differential output voltages according to the second differential amplified voltages.

2. The MREC circuit of claim 1, wherein the input transistor pair comprises:
   a first field-effect transistor, comprising a first drain, a first gate and a first source; and
   a second field-effect transistor, comprising a second drain, a second gate and a second source;
   wherein the first source and the second source are coupled to the tail current source circuit; the first gate and the second gate are configured to receive the differential input voltages; and the first drain and the second drain are coupled to the plurality of ER circuits to output the first differential amplified voltages.

3. The MREC circuit of claim 1, wherein the adjustor circuit comprises:
   a third field-effect transistor, comprising a third drain, a third gate and a third source; and
   a fourth field-effect transistor, comprising a fourth drain, a fourth gate and a fourth source;
   wherein the third source and the fourth source receive the first differential amplified voltages respectively; the third gate and the fourth gate receive the differential bias voltages respectively; and the third drain and the third drain are coupled to the latch circuit to output the second differential amplified voltages.

4. The MREC circuit of claim 1, wherein the latch circuit comprises:
   a fifth field-effect transistor, comprising a fifth drain, a fifth gate and a fifth source;
   a sixth field-effect transistor, comprising a sixth drain, a sixth gate and a sixth source;
   a seventh field-effect transistor, comprising a seventh drain, a seventh gate and a seventh source; and
   an eighth field-effect transistor, comprising an eighth drain, an eighth gate and an eighth source;
   wherein the fifth source and the sixth source receive the second differential amplified voltages respectively; the seventh source and the eighth source are coupled to a supply voltage; the fifth gate, the seventh gate, the sixth drain and the eight drain are coupled to a first output node; and the sixth gate, the eighth gate, the fifth drain and the seventh drain are coupled to a second output node;
   wherein the first output node and the second output node output the differential output voltages.

5. A comparison method for a multiple-reference-embedded comparator (MREC) circuit, comprising:
   utilizing an input transistor pair, coupled to a tail current source circuit, to perform a first pre-amplification to generate first differential amplified voltages according to differential input voltages; and
   utilizing each of a plurality of embedded reference (ER) circuits, each coupled to the input transistor pair, to perform a second pre-amplification to generate second differential amplified voltages according to the first differential amplified voltages, and to perform a discrete-time comparison to generate differential output voltages according to the second differential amplified voltages;
   wherein each of the plurality of ER circuits comprises:
      an adjustor circuit, coupled to the input transistor pair, configured to perform the second pre-amplification to generate the second differential amplified voltages according to the first differential amplified voltages and differential bias voltages; and
      a latch circuit, coupled to the adjustor circuit, configured to perform the discrete-time comparison to generate the differential output voltages according to the second differential amplified voltages.

6. The comparison method of claim 5, wherein the input transistor pair comprises:
   a first field-effect transistor, comprising a first drain, a first gate and a first source; and
   a second field-effect transistor, comprising a second drain, a second gate and a second source;
   wherein the first source and the second source are coupled to the tail current source circuit; the first gate and the second gate are configured to receive the differential input voltages; and the first drain and the second drain are coupled to the plurality of ER circuits to output the first differential amplified voltages.

7. The comparison method of claim 5, wherein the adjustor circuit comprises:
   a third field-effect transistor, comprising a third drain, a third gate and a third source; and a fourth field-effect transistor, comprising a fourth drain, a fourth gate and a fourth source;

wherein the third source and the fourth source receive the first differential amplified voltages respectively; the third gate and the fourth gate receive the differential bias voltages respectively; and the third drain and the third drain are coupled to the latch circuit to output the second differential amplified voltages.

8. The comparison method of claim 5, wherein the latch circuit comprises:

a fifth field-effect transistor, comprising a fifth drain, a fifth gate and a fifth source;

a sixth field-effect transistor, comprising a sixth drain, a sixth gate and a sixth source;

a seventh field-effect transistor, comprising a seventh drain, a seventh gate and a seventh source; and an eighth field-effect transistor, comprising an eighth drain, an eighth gate and an eighth source;

wherein the fifth source and the sixth source receive the second differential amplified voltages respectively; the seventh source and the eighth source are coupled to a supply voltage; the fifth gate, the seventh gate, the sixth drain and the eight drain are coupled to a first output node; and the sixth gate, the eighth gate, the fifth drain and the seventh drain are coupled to a second output node;

wherein the first output node and the second output node output the differential output voltages.

* * * * *